United States Patent
Wang et al.

(10) Patent No.: US 8,344,805 B2
(45) Date of Patent: Jan. 1, 2013

(54) HIGH-FREQUENCY DIFFERENTIAL AMPLIFIER CIRCUIT

(75) Inventors: Tong Wang, Kawasaki (JP); Toshiya Mitomo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/037,701

(22) Filed: Mar. 1, 2011

(65) Prior Publication Data

US 2012/0068769 A1    Mar. 22, 2012

(30) Foreign Application Priority Data

Sep. 16, 2010 (JP) ................ 2010-208089

(51) Int. Cl.
*H03F 3/45* (2006.01)

(52) U.S. Cl. ....................... 330/260; 330/282

(58) Field of Classification Search .......... 330/260, 330/282, 291, 294
See application file for complete search history.

(56) References Cited

U.S. PATENT DOCUMENTS

| | | | |
|---|---|---|---|
| 6,882,226 B2 * | 4/2005 | Cho et al. ................ | 330/282 |
| 7,109,793 B2 * | 9/2006 | Nakatani et al. ............ | 330/252 |
| 7,256,646 B2 * | 8/2007 | Eid et al. ................ | 330/260 |
| 7,598,811 B2 * | 10/2009 | Cao ................ | 330/260 |
| 7,633,337 B2 * | 12/2009 | Nam et al. .............. | 330/260 |
| 7,697,915 B2 * | 4/2010 | Behzad et al. ............. | 330/253 |
| 7,852,158 B2 * | 12/2010 | Kobayashi et al. .......... | 330/260 |
| 2007/0024377 A1 * | 2/2007 | Wang et al. ................ | 330/305 |

FOREIGN PATENT DOCUMENTS

| | | |
|---|---|---|
| JP | 38-23473 | 11/1963 |
| JP | 39-31973 | 10/1964 |
| JP | 2005-12770 | 1/2005 |
| JP | 2007-6484 | 1/2007 |

OTHER PUBLICATIONS

Chan, et al., "A 60GHz-Band 1V 11.5dBm Power Amplifier with 11% PAE in 65nm CMOS", ISSCC 2009, Session 22, PA and Antenna Interface, 22.4, pp. 380-382, (2009).

Notification of Reason for Rejection issued by the Japanese Patent Office on Jul. 20, 2012, for Japanese Patent Application No. 2010-208089, and English-language translation thereof.

Chan, et al., "A 60GHz-Band 1V 11.5dBm Power Amplifier with 11% PAE in 65nm CMOS", ISSCC 2009, Session 22, PA and Antenna Interface, 22.4, pp. 380-382, (2009).

Galal, et al., "10-Gb/s Limiting Amplifier and Laser/Modulator Driver in 0.18-μm CMOS Technology", IEEE Journal of Solid-State Circuits, vol. 38, No. 12, pp. 2138-2146, (Dec. 2003).

* cited by examiner

*Primary Examiner* — Khanh V Nguyen
(74) *Attorney, Agent, or Firm* — Finnegan, Henderson, Farabow, Garrett & Dunner, L.L.P.

(57) ABSTRACT

There is provided a high-frequency differential amplifier circuit comprising: a first MOS transistor, a second MOS transistor, a first positive feedback element and a second positive feedback element. The first MOS transistor and the second MOS transistor each has a source connected to a first power source and a drain connected through loads to a second power source. The first and second MOS transistors receives at their gates, first and second input signals having phases reverse to each other. The first positive feedback element includes a first capacitor and a first variable resistance connected in series between the gate of the first MOS transistor and the drain of the second MOS transistor. The second positive feedback element includes a second capacitor and a second variable resistance connected in series between the gate of the second MOS transistor and the drain of the first MOS transistor.

2 Claims, 5 Drawing Sheets

US 8,344,805 B2

HIGH-FREQUENCY DIFFERENTIAL AMPLIFIER CIRCUIT

CROSS REFERENCE TO RELATED APPLICATIONS

This application is based upon and claims the benefit of priority from the prior Japanese Patent Application No. 2010-208089, filed on Sep. 16, 2010, the entire contents of which are incorporated herein by reference.

FIELD

The embodiments of the present invention relate to a high-frequency differential amplifier circuit.

BACKGROUND

There is known a high-frequency differential amplifier circuit for amplifying high-frequency differential signals by using a pair (differential pair) of amplifier transistors. Each amplifier transistor has a gate-drain capacitance (Cgd) between its gate and drain, and there is a problem that high frequency gain is reduced by a negative feedback loop through this capacitance Cgd.

In order to prevent the reduction in gain, it is known to arrange capacitors (cross-coupled capacitors) between the gate of one differential transistor and the drain of the other differential transistor, and between the gate of the other differential transistor and the drain of one differential transistor. These capacitors are arranged to cancel the reduction in high frequency gain due to the negative feedback loop. The capacitor is made of a metal material, for example. The route from the drain of the other or one differential transistor to the gate of one or the other differential transistor through the capacitor is called a positive feedback loop or a neutralization loop.

Now the impedance of the negative feedback loop and that of neutralization loop will be considered. The impedance of the negative feedback loop has a real component supplied by a gate resistance Rg, while the impedance of the neutralization loop has only an imaginary component supplied by the capacitor. Accordingly, it is impossible to completely neutralize the negative feedback of the amplifier transistors only with the cross-coupled capacitors.

The capacitances of the cross-coupled capacitors are both represented as Cf. When the capacitance Cf is smaller than the capacitance value Cgd of the amplifier transistor, a stability coefficient K of the amplifier circuit becomes larger as the capacitance Cf is made larger (that is, the stability of the amplifier circuit is increased). This is because total signal feedback amount (total of the feedback amount of the neutralization loop and the feedback amount of the negative feedback loop) becomes smaller as the capacitance Cf becomes larger.

When the value of the capacitance Cf and that of the capacitance Cgd are nearly the same, the total signal feedback amount becomes nearly zero, and the stability coefficient K has the maximum value. Note that K cannot be infinite since it is impossible in the above structure to completely eliminate the total signal feedback amount as stated above. Further, when the capacitance Cf is made larger, total positive feedback amount is increased and the stability coefficient K becomes smaller (that is, the stability of the amplifier circuit is reduced).

Note that the circuit is stable when the value of the stability coefficient K is equal to or greater than 1, and the stability is increased as the value of K becomes larger. The circuit is not stable when the value of K is less than 1, and the stability is reduced as the value becomes smaller. When K is 1, the maximum gain can be obtained without causing oscillation.

At the design stage, a great gain design value can be obtained by setting the design value of the capacitance Cf so that K is around 1 as nearly as possible, which leads to a great possibility that the amplifier oscillates when there is a gap between the actual capacitance Cf and the design value due to manufacturing variation (the stability coefficient K becomes smaller than 1). Thus, at the design stage, the capacitance Cf must be determined considering the scope of the stability, and it is difficult to realize a design for obtaining the maximum gain.

DETAILED DESCRIPTION

Figure 1:
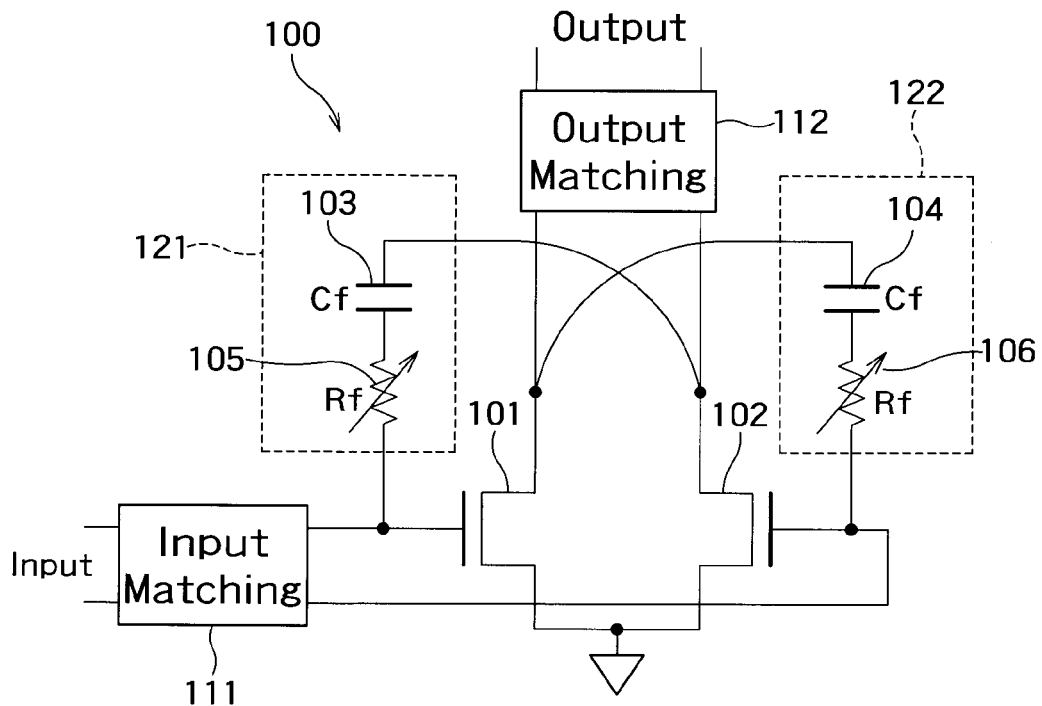
FIG. 1 is a diagram showing an example of an equivalent circuit of a high-frequency differential amplifier circuit according to a first embodiment.

According to one embodiment of the present invention, there is provided a high-frequency differential amplifier circuit comprising: a first MOS transistor, a second MOS transistor, a first positive feedback element and a second positive feedback element.

The first MOS transistor and the second MOS transistor each has a source connected to a first power source and a drain connected through loads to a second power source. The first and second MOS transistors receives at their gates, first and second input signals having phases reverse to each other.

The first positive feedback element includes a first capacitor and a first variable resistance connected in series between the gate of the first MOS transistor and the drain of the second MOS transistor.

The second positive feedback element includes a second capacitor and a second variable resistance connected in series between the gate of the second MOS transistor and the drain of the first MOS transistor.

Hereinafter, the embodiments of the present invention will be explained referring to the drawings. Note that components attached with the same reference number similarly operate in the following embodiments, and overlapping explanation will be omitted.

First Embodiment

FIG. 1 shows an example of an equivalent circuit of a high-frequency differential amplifier circuit according to a first embodiment.

This amplifier circuit 100 receives, through an input matching circuit 111, first and second input signals (differential signals) having phases reverse to each other, amplifies the first and second input signals by a differential pair of transistors 101 and 102 respectively, and outputs the signals through an output matching circuit 112.

Each of the amplifier transistors 101 and 102 is an NMOS (N-channel metal oxide semiconductor) transistor. The amplifier transistor 101 corresponds to a first MOS transistor, and the amplifier transistor 102 corresponds to a second MOS transistor.

The gate of the amplifier transistor 101 is connected to a first output terminal in the input matching circuit 111. The gate of the amplifier transistor 102 is connected to a second output terminal in the input matching circuit 111. In this case, the first output terminal is a positive phase output terminal, and the second output terminal is a negative phase output terminal, but this combination may be reversed. The input matching circuit 111 supplies appropriate input impedance characteristics to the gates of the amplifier transistors 101 and 102.

The sources of the amplifier transistors 101 and 102 are commonly connected to the ground. The ground (GND) in the present embodiment corresponds to a first power source.

Figure 5:
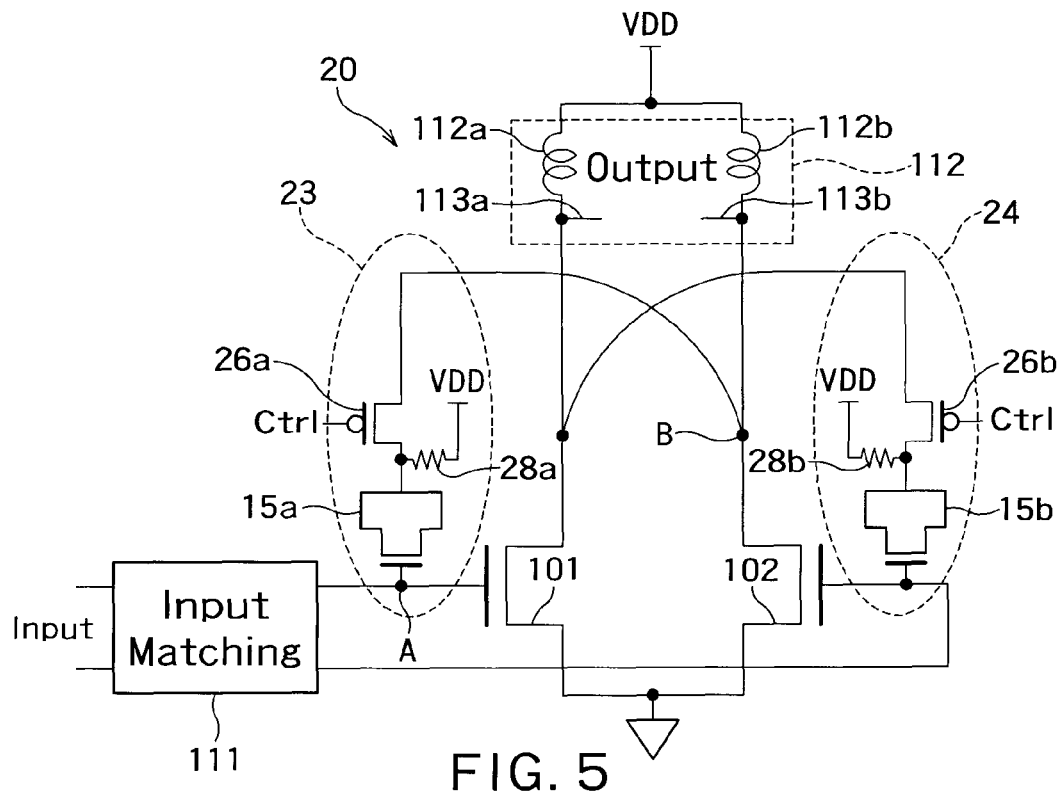
FIG. 5 is a diagram showing a high-frequency differential amplifier circuit according to a third embodiment.

The drains of the amplifier transistors 101 and 102 are connected to a power supply voltage (VDD) through the output matching circuit 112 (see FIG. 5). The power supply voltage in the present embodiment corresponds to a second power source.

The output matching circuit 112 includes loads connected to the drains of the amplifier transistors 101 and 102 respectively. Further, the output matching circuit 112 includes output terminals to obtain outputs from the drains of the amplifier transistors 101 and 102 respectively. The loads connected to the drains of the amplifier transistors 101 and 102 are inductors or resistances, for example. By arranging these loads, appropriate output impedance characteristics are supplied to the output terminals (see FIG. 5, which will be explained later).

A positive feedback element (neutralizing element) 121 is arranged between the drain of the amplifier transistor 102 and the gate of the amplifier transistor 101, and a positive feedback element (neutralizing element) 122 is arranged between the drain of the amplifier transistor 101 and the gate of the amplifier transistor 102. That is, the positive feedback elements 121 and 122 are connected in cross-coupled fashion between the drain of the other or one amplifier transistor and the gate of one or the other amplifier transistor. The loop from the drain to the gate generated through the positive feedback element is called positive feedback loop or neutralization loop. The positive feedback element 121 corresponds to a first positive feedback element, and the positive feedback element 122 corresponds to a second positive feedback element.

The positive feedback element 121 includes a capacitor (first capacitor) 103 and a variable resistance (first variable resistance) 105 connected in series. The positive feedback element 122 includes a capacitor (second capacitor) 104 and a variable resistance (second variable resistance) 106 connected in series.

The capacitors 103 and 104 are MOS transistors having a shape similar to that of the amplifier transistors 101 and 102, for example. A capacitor formed by using an MOS transistor is called an MOS capacitor. The MOS capacitor can be formed by connecting the source and drain of an MOS transistor.

The MOS capacitor has two terminals. One terminal is connected to the gate, and the other terminal is connected to both of the source and drain. The capacitance of the MOS capacitor is obtained by totalizing the capacitance between the gate and drain and the capacitance between the gate and source.

The variable resistances 105 and 106 may be MOS transistors, for example. In this case, the variable resistances 105 and 106 are NMOS transistors.

A negative feedback loop is generated between the gate and drain of the amplifier transistor 101, and the negative feedback loop is generated also between the gate and drain of the amplifier transistor 102.

Figure 2:
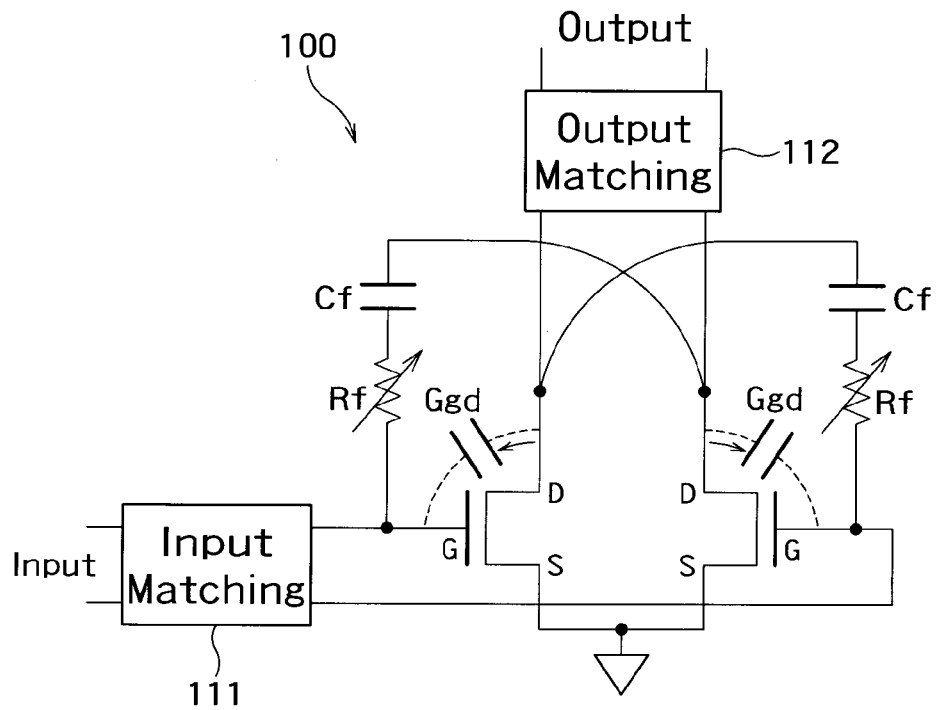
FIG. 2 is a diagram showing a capacitance formed between the gate and drain of an amplifier transistor.

The negative feedback loop of the amplifier transistor 101 is formed by a gate-drain capacitance (Cgd) formed between the gate and drain and a gate resistance Rg. Similarly, the negative feedback loop of the amplifier transistor 102 is formed by the gate-drain capacitance (Cgd) formed between the gate and drain and the gate resistance Rg. FIG. 2 shows the gate-drain capacitances (Cgd) formed in the amplifier transistors 101 and 102.

These negative feedback loops reduce the gate voltages of the amplifier transistors 101 and 102, by which the high frequency gain of this amplifier circuit is extremely reduced. However, the positive feedback elements 121 and 122 neutralize the negative feedback, and thus the reduction in the high frequency gain can be greatly restrained. Hereinafter, how the positive feedback elements 121 and 122 neutralize the negative feedback will be explained in detail. For simplification, explanation will be made focusing on the positive feedback element 121, and the explanation of the positive feedback element 122 will be omitted since the operation thereof is obvious from the explanation of the positive feedback element 121.

Feedback amount of the positive feedback element 121 depends on both of capacitance Cf of the capacitor 103 and resistance value Rf of the variable resistance 105. In other words, impedance of the neutralization loop generated by the positive feedback element 121 has a real component supplied by the variable resistance 105 and an imaginary component supplied by the capacitor 103.

On the other hand, impedance of the negative feedback in the amplifier transistor 101 has a real component supplied by the gate resistance and an imaginary component supplied by the gate-drain capacitance.

Accordingly, the positive feedback element 121 having the real component and the imaginary component can surely cancel (neutralize) the negative feedback in the amplifier transistor 101. This neutralization can be expressed as in FIG. 3.

Figure 3:
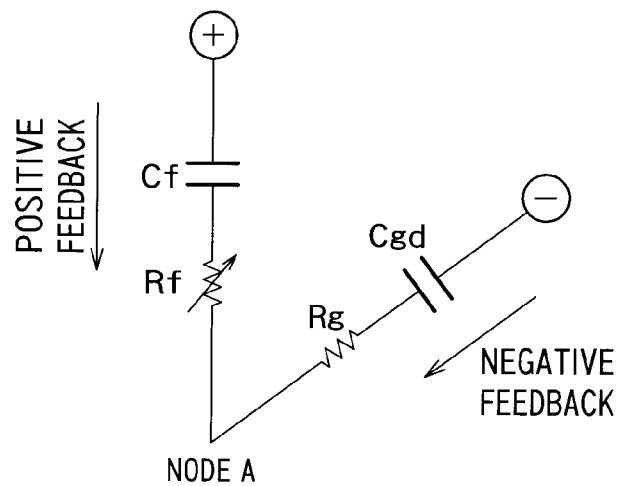
FIG. 3 is a diagram explaining how negative feedback is neutralized.

In FIG. 3, signs "+" and "−" mean that the polarity of the drain of the amplifier transistor 101 and that of the drain of the amplifier transistor 102 are reverse to each other. Node A represents the gate terminal of the amplifier transistor 102. Potential variation in the gate can be restrained by achieving neutralization.

In the above structure, by adjusting the resistance value Rf of the variable resistance 105, total feedback amount (total of the feedback amount of the neutralization loop and the feedback amount of the negative feedback loop) can be controlled. Accordingly, at the design stage, the capacitance Cf of the capacitor 103 and the resistance value Rf of the variable resistance 105 are determined so that the gain of the amplifier circuit 100 becomes the maximum (that is, so that stability coefficient K becomes 1), and at the post-manufacturing stage, the resistance value Rf is adjusted (feedback amount is controlled) to compensate manufacturing variation. In this way, a design for obtaining the maximum gain can be realized. Hereinafter, this will be further explained in detail.

The amplifier circuit is stable (does not oscillate) when the stability coefficient K is 1 or greater, and the stability is increased as the value becomes larger. Further, the amplifier circuit is not stable (oscillates) when the stability coefficient K is less than 1, and the stability is reduced as the value becomes smaller. When K is 1, the maximum gain can be obtained without causing oscillation.

Therefore, at the post-manufacturing stage, the feedback amount is controlled so that the stability coefficient K becomes exactly or approximately 1 by adjusting the resistance value Rf to compensate manufacturing variation, by which the maximum gain can be obtained while restraining oscillation. In this case, relative variation in capacitance between the capacitors 103 and 104 and the amplifier transistors 101 and 102 can be reduced since the capacitors 103 and 104 are MOS transistors formed so as to be similar to the amplifier transistors (MOS transistors) 101 and 102. That is, when a gap is generated between a design value and the gate-drain capacitance Cgd of the amplifier transistors 101 and 102 at the post-manufacturing stage, the capacitors 103 and 104 also have a similar gap, and thus the amplifier circuit is less influenced by manufacturing variation.

Here, the positive feedback element can be formed of a variable capacitor instead of the capacitor and the variable resistance. However, there is a problem that the variable capacitor causes a great loss due to its parasitic component at a frequency which is equal to or higher than a millimetre wave frequency. Further, the shape of the variable capacitor is different from (or not similar to) that of the amplifier transistors 101 and 102, and thus there is a problem that relative variation in capacitance becomes greater between the capacitance of the variable capacitor and the gate-drain capacitance Cgd of the amplifier transistor at the manufacturing stage.

On the other hand, in the present embodiment, by using MOS transistors as the variable resistances 105 and 106, the resistance value Rf of the variable resistance 105 can be reduced compared to the parasitic resistance of a general variable capacitor, and thus the loss can be greatly restrained. Further, as stated above, the capacitors 103 and 104 are MOS transistors formed similarly to the amplifier transistors 101 and 102, and thus there is an advantage that the relative variation in capacitance at the manufacturing stage can be reduced.

Second Embodiment

Figure 4:
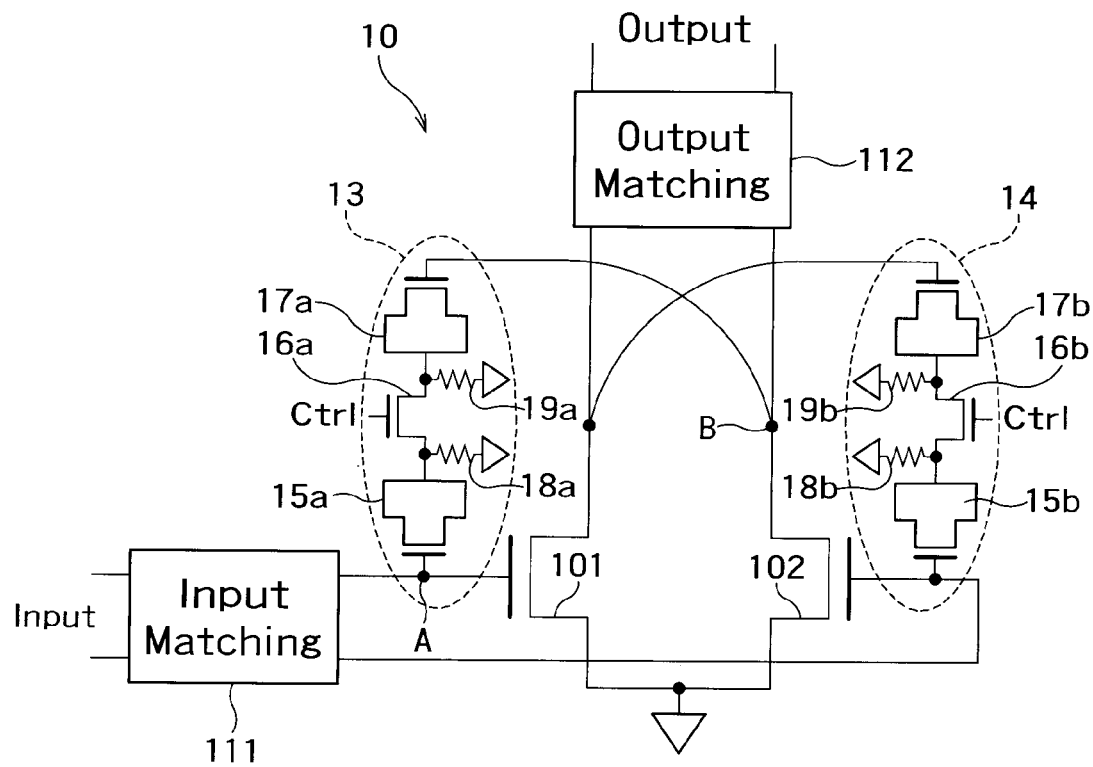
FIG. 4 is a diagram showing a high-frequency differential amplifier circuit according to a second embodiment.

FIG. 4 shows a high-frequency differential amplifier circuit 10 according to a second embodiment.

The high-frequency differential amplifier circuit 10 of FIG. 4 shows an example of a concrete structure of the positive feedback elements 121 and 122 in the high-frequency differential amplifier circuit 100 of FIG. 1.

A positive feedback element 13 on the side of the amplifier transistor 101 includes a MOS capacitor 17a, a variable resistance 16a, and a MOS capacitor 15a connected in series. The variable resistance 16a is an NMOS transistor. The MOS capacitor 15a has same shape as the MOS capacitor 17a. The MOS capacitors 17a and 15a are similar shape to the amplifier transistors 101 and 102.

The source and drain of the variable resistance (NMOS capacitor) 16a are connected to the ground through loads (first and second loads) 18a and 19a respectively. The loads 18a and 19a are resistances or inductors. In this example, resistances are employed.

One end of the MOS capacitor 17a is connected to the drain of the amplifier transistor 102, and the other end thereof is connected to the drain of the variable resistance (NMOS capacitor) 16a. One end of the MOS capacitor 15a is connected to the source of the variable resistance (NMOS capacitor) 16a, and the other end thereof is connected to the gate of the amplifier transistor 101.

A positive feedback element 14 on the side of the amplifier transistor 102 includes a MOS capacitor 17b, a variable resistance 16b, and a MOS capacitor 15b connected in series. The variable resistance 16b is an NMOS transistor. The MOS capacitor 15b is has same shape as the MOS capacitor 17b. The MOS capacitors 17b and 15b are similar shape to the amplifier transistors 101 and 102.

The source and drain of the variable resistance (NMOS capacitor) 16b are connected to the ground through loads (third and fourth loads) 18b and 19b respectively. The loads 18b and 19b are resistances or inductors. In this example, resistances are employed.

One end of the MOS capacitor 17b is connected to the drain of the amplifier transistor 101, and the other end thereof is connected to the drain of the variable resistance (NMOS capacitor) 16b. One end of the MOS capacitor 15b is connected to the source of the variable resistance (NMOS capacitor) 16b, and the other end thereof is connected to the gate of the amplifier transistor 102.

Explanation will be made on the correspondence relation between the structure in FIG. 1 and that in FIG. 4. Total capacitance of the MOS capacitors 15a and 17a in FIG. 4 corresponds to the capacitor value Cf of the capacitor 103 in FIG. 1. The resistance value of the NMOS transistor 16a in FIG. 4 corresponds to the resistance value Rf of the variable resistance 105 in FIG. 1. The correspondence relation about the positive feedback element 14 can be similarly applied to the positive feedback element 13.

The variable resistance (NMOS transistor) 16a is sandwiched between the MOS capacitors 15a and 17a which are used as DC cut elements for the source and drain terminals of the NMOS transistor 16a. The direct-current potentials of the drain and source of the NMOS transistor 16a are required to be fixed at 0V (ground), but the direct-current potentials of nodes A and B in the drawing are both not 0V. Accordingly, the MOS capacitors 15a and 17a cut the direct-current potentials, and the resistances 18a and 19a fix the direct-current potentials of the drain and source of the NMOS transistor 16a at 0V (ground).

As stated above, the source and drain terminals of the NMOS transistor 16a are connected to the ground through the resistances 18a and 19a respectively, and thus bias voltage becomes the same as the ground voltage and the resistance value of the NMOS transistor 16a changes in a broader range when the potential of the gate terminal (Ctrl terminal) is changed.

Positive feedback amount can be controlled by changing the potential of the gate terminal at the post-manufacturing stage. Therefore, the maximum gain can be obtained by determining the total capacitance of the MOS capacitors 15a and 17a so that the stability coefficient K becomes approximately 1 at the design stage, and by adjusting the potential of the gate terminal at the post-manufacturing stage.

Third Embodiment

In the example shown in the second embodiment, the variable resistance used in the positive feedback element is an NMOS transistor. In the example shown in the present embodiment, the variable resistance used in the positive feedback element is a PMOS (P-channel metal oxide semiconductor) transistor.

FIG. 5 shows a high-frequency differential amplifier circuit 20 according to a third embodiment.

A positive feedback element 23 on the side of the amplifier transistor 101 includes the MOS capacitor 15a and a variable resistance 26a connected in series. The variable resistance 26a is a PMOS transistor. The source and drain of the variable resistance (PMOS capacitor) 26a are connected to the power supply voltage (VDD) through the drain of the amplifier transistor 102 and a load (fifth load) 28a. One end of the load 28a is connected to a connecting point between the variable resistance 26a and the MOS capacitor 15a, and the other end of the load 28a is connected to the VDD. The load 28a is a resistance or an inductor (coil). In this example, a resistance is employed.

A positive feedback element 24 on the side of the amplifier transistor 102 includes the MOS capacitor 15b and a variable resistance 26b connected in series. The variable resistance 26b is a PMOS transistor. The source and drain of the variable resistance (PMOS capacitor) 26b are connected to the power supply voltage (VDD) through the drain of the amplifier transistor 101 and a load 28b. One end of the load 28b is connected to a connecting point between the variable resistance 26b and the MOS capacitor 15b, and the other end of the load 28b is connected to the VDD. The load 28b is a resistance or an inductor. In this example, a resistance is employed.

Note that the drawing shows that loads 112a and 112b are connected to the drains of the amplifier transistors 101 and 102. Further, output terminals 113a and 113b are connected to the drains of the amplifier transistors 101 and 102.

This structure does not include components corresponding to the combination of the resistance 19a and the MOS capacitor 17a in the positive feedback element 13 of FIG. 4. The same can be applied to the positive feedback element 14. Hereinafter, the reason for this structure will be explained.

When using a PMOS transistor (variable resistance), the direct-current potentials of the drain and source of the PMOS transistor are both required to be fixed at the VDD (power supply voltage). There is a case where the direct-current potential (potential of the node B) of the drain of the amplifier transistor (main MOS) 102 is the power supply voltage, depending on the structure of the amplifier circuit. In such a case, capacitors for cutting direct current are not necessary, and the direct-current potential is fixed at the VDD by directly connecting the PMOS transistor.

When considering the direct-current potential, the capacitor 15a and the resistance 28a also are not necessary if the direct-current potential of the gate (node A) of the amplifier transistor (main MOS) 101 is the VDD, but the gate-drain capacitance Cgd of the amplifier transistor 101 must be compensated. For this purpose, a capacitance is necessary in a feedback path (positive feedback loop), and thus the MOS capacitor 15a cannot be removed. Thus, the resistance 28a is also necessary (to fix the direct-current potential after cutting direct current).

In this structure, the combination of the ground resistance 19a and the MOS capacitor 17a in the positive feedback element 13 of FIG. 4 is not necessary. There is also a case where components corresponding to the combination of the ground resistance 18a and the MOS capacitor 15a in the positive feedback element 13 of FIG. 4 are not necessary, depending on the design of bias operating points of the amplifier transistors 101 and 102 (the same can be applied to the positive feedback element 14). In this case, the unnecessary components should be removed while keeping components corresponding to the combination of the resistance 19a and the MOS capacitor 17a in the positive feedback element 13.

As stated above, the present embodiment makes it possible to reduce circuit area, compared to the second embodiment.

Fourth Embodiment

Figure 6:
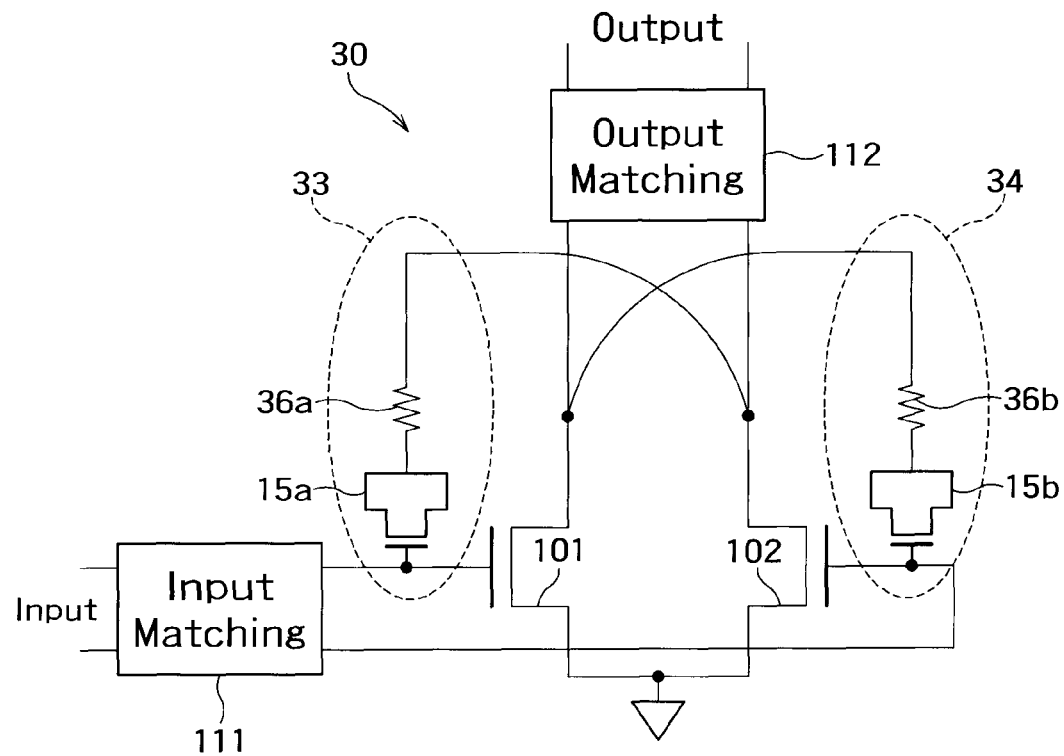
FIG. 6 is a diagram showing a high-frequency differential amplifier circuit according to a fourth embodiment.

In the first to third embodiments explained above, a variable resistance is used in the positive feedback element, but a fixed resistance can be used instead of the variable resistance. FIG. 6 shows the structure of a high-frequency differential amplifier circuit 30 according to the present embodiment.

A positive feedback element (third positive feedback element) 33 on the side of the amplifier transistor 101 includes the MOS capacitor 15a and a fixed resistance (first fixed resistance) 36a connected in series. One end of the fixed resistance 36a is connected to the drain of the amplifier transistor 102, and the other end thereof is connected to one end of the MOS capacitor 15a.

A positive feedback element (fourth positive feedback element) 34 on the side of the amplifier transistor 102 includes the MOS capacitor 15b and a fixed resistance (second fixed resistance) 36b connected in series. One end of the fixed resistance 36b is connected to the drain of the amplifier transistor 101, and the other end thereof is connected to one end of the MOS capacitor 15b.

When the fixed resistances 36a and 36b are not MOS transistors, there is no need to fix the direct-current potentials. Accordingly, there is no need to arrange the resistances 18a, 19a, 18b, and 19b as shown in FIG. 4 or the resistances 28a and 28b as shown in FIG. 5. In addition to the fixed resistances 36a and 36b, each of the positive feedback elements 33 and 34 requires only one MOS capacitor to compensate the gate-drain capacitances of the amplifier transistors 101 and 102.

In this structure, feedback amount cannot be controlled at the post-manufacturing stage, but it is possible to design a circuit more stable than that including only a capacitor in the positive feedback loop as described in the background, which is because impedance in the positive feedback loop includes a real component in this structure.

Fifth Embodiment

Figure 7:
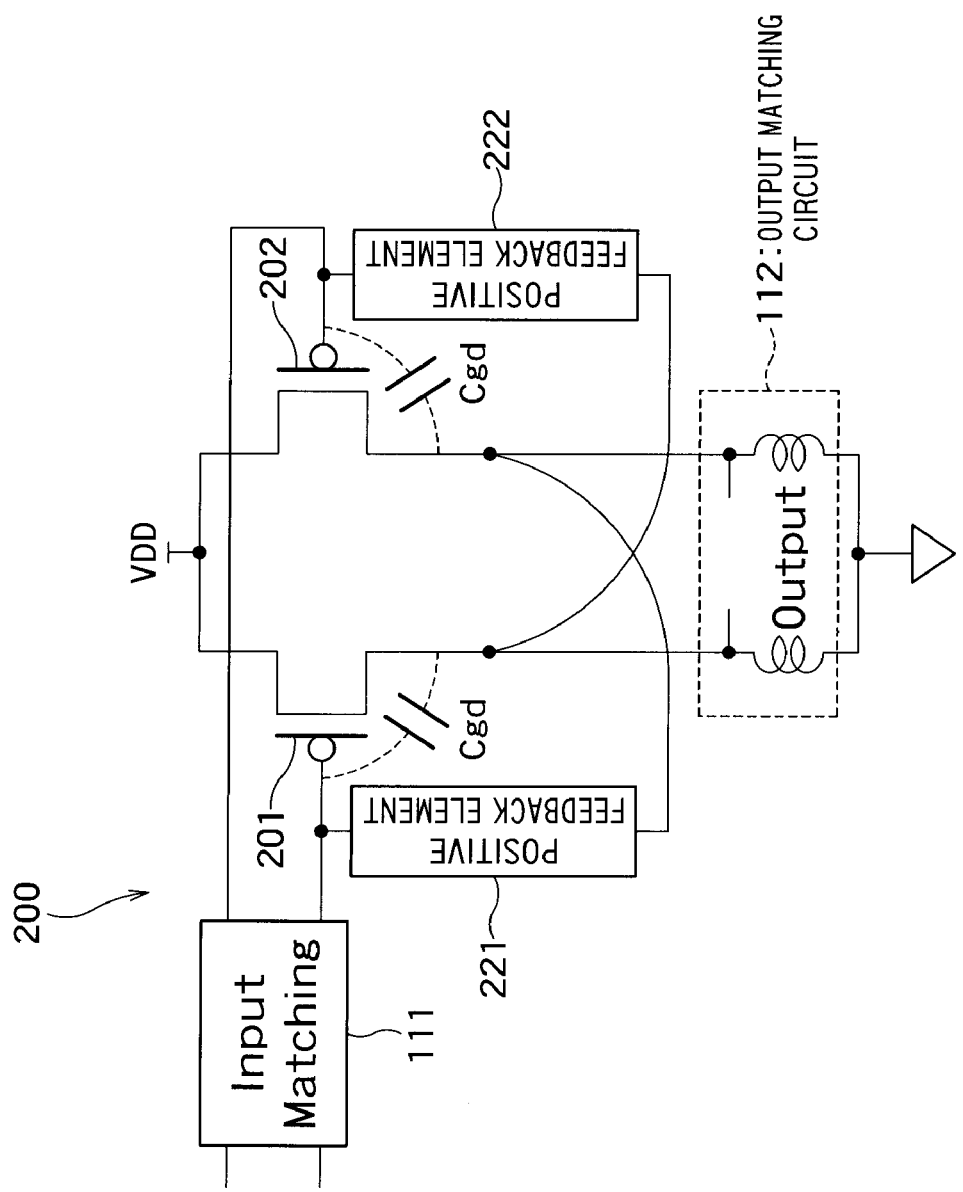
FIG. 7 is a diagram showing a high-frequency differential amplifier circuit according to a fifth embodiment.

In the examples shown in the first to fourth embodiments, NMOS transistors are used as the amplifier transistors 101 and 102, but PMOS transistors can be used as the amplifier transistors 101 and 102. FIG. 7 shows the structure of a high-frequency differential amplifier circuit 200 in this case.

In this structure, both of amplifier transistors 201 and 202 are PMOS transistors. The sources of the PMOS transistors 201 and 202 are connected to the power supply voltage (VDD), and the drains thereof are connected to the ground through the output matching circuit 112. In the present embodiment, the ground corresponds to the first power source, and the source corresponds to the second power source.

A positive feedback element 221 on the side of the amplifier transistor (PMOS transistor) 201 and a positive feedback element 222 on the side of the amplifier transistor (PMOS transistor) 202 can be formed similarly to the first to fourth embodiments.

Sixth Embodiment

Figure 8:
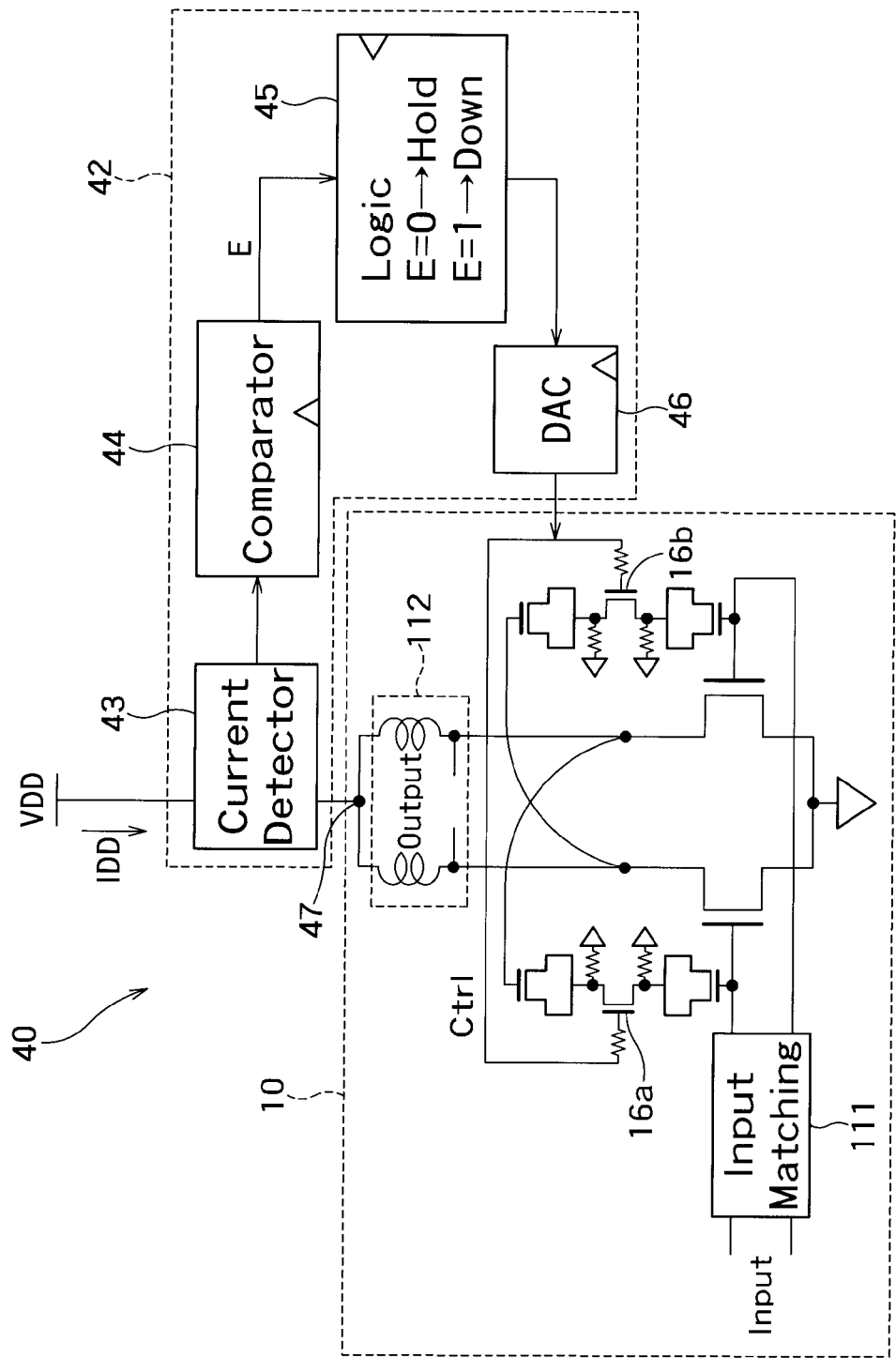
FIG. 8 is a diagram showing a high-frequency differential amplifier circuit according to a sixth embodiment.

FIG. 8 shows a high-frequency differential amplifier circuit 40 according to a sixth embodiment.

The high-frequency differential amplifier circuit 40 of FIG. 8 includes the amplifier circuit 10 formed as in FIG. 4, and a automatic control circuit 42 for automatically controlling the potentials of the gate terminals (Ctrl terminals) of the variable resistances (MOS transistors) 16a and 16b in the amplifier circuit 10. The operation of the amplifier circuit 10 is already explained using FIG. 4, and thus overlapping explanation will be omitted.

The control circuit 42 includes: an alternating current detector 43; a comparator 44; a logic circuit 45; and a digital-analog converter (DAC) 46 connected in cascade.

The alternating current detector 43 detects an alternating current component of current IDD flowing from the power supply voltage VDD to a common mode node 47 in the output matching circuit 112 of the amplifier circuit 10. The alternating current detector 43 converts the amplitude value of the detected alternating current component of the current IDD into a direct current voltage, and transmits the converted direct current voltage to the comparator 44.

The comparator 44 compares the received direct current voltage with a predetermined reference voltage, and transmits a 1-bit digital value E representing the comparison result to the logic circuit 45. The comparison result shows that E is 1 when the direct current voltage is larger than the predetermined reference voltage, and E is 0 when the direct current voltage is equal to or smaller than the predetermined reference voltage.

When E is 0, the logic circuit 45 retains and outputs the output value in the preceding clock cycle. When E is 1, the logic circuit 45 outputs a value obtained by subtracting a constant value from the output value in the preceding clock cycle.

The DAC 46 converts the output value of the logic circuit 45 into an analog voltage value, and outputs the analog voltage value to the gate terminals of the variable resistances (MOS transistors) 16a and 16b.

The comparator 44, the logic circuit 45, and the DAC 46 synchronously operate in accordance with the clock supplied by a clock supply source (not shown)(note that the clock supply path from the clock supply source is omitted in the drawing for simplification).

The initial voltage value of the gate terminals when turning on the high-frequency differential amplifier circuit 40 is set at a power source potential by which the variable resistance values Rf (resistance values of the MOS transistors 16a and 16b) become the minimum.

The control circuit 42 operates as stated above and constantly passes the current IDD to monitor the stability of the amplifier circuit 10. When the amplifier circuit 10 operates stably, the alternating current component of the current IDD has a small amplitude due to harmonic. On the other hand, when the amplifier circuit 10 oscillates, the alternating current component of the current IDD has a large amplitude due to the oscillation. When the control circuit 42 judges that the amplifier circuit 10 operates unstably, the control circuit 42 gradually reduces the potentials of the gate terminals until the amplifier circuit 10 operates stably. As a result, the potentials of the gate terminals are adjusted to be the maximum potential which enables the amplifier circuit 10 to operate constantly stably. As stated above, the variable resistance value Rf is adjusted to be the minimum value which enables the high-frequency differential amplifier circuit 40 to operate constantly stably. Accordingly, the maximum gain can be obtained constantly stably in the amplifier circuit 10 regardless of manufacturing variation and temperature change.

The invention claimed is:

1. A high-frequency differential amplifier circuit, comprising:
   a first MOS transistor and a second MOS transistor each having a source connected to a first power source and a drain connected through loads to a second power source, the first and second MOS transistors receiving, at their gates, first and second input signals having phases reverse to each other;
   a first positive feedback element configured to include two first capacitors, a first variable resistance, a first load and a second load, and connected between the gate of the first MOS transistor and the drain of the second MOS transistor,
   the first variable resistance being an NMOS transistor and arranged between the two first capacitors,
   one ends of the first and second loads being connected to both terminals of the first variable resistance, and
   the other ends of the first and second loads being connected to the first power source; and
   a second positive feedback element configured to include two second capacitors, a second variable resistance, a third load and a fourth load, and connected between the gate of the second MOS transistor and the drain of the first MOS transistor,
   the second variable resistance being an NMOS transistor and arranged between the two second capacitors,
   one ends of the third and fourth loads being connected to both terminals of the second variable resistance, and
   the other ends of the third and fourth loads being connected to the first power source.

2. A high-frequency differential amplifier circuit, comprising:
   a first MOS transistor and a second MOS transistor each having a source connected to a first power source and a drain connected through loads to a second power source, the first and second MOS transistors receiving, at their gates, first and second input signals having phases reverse to each other;
   a first positive feedback element configured to include a first capacitor, a first variable resistance and a first load, and connected between the gate of the first MOS transistor and the drain of the second MOS transistor,
   the first variable resistance being a PMOS transistor,
   one end of the first load being connected to a connecting point between the PMOS transistor and the first capacitor, and
   the other end of the first load being connected to the second power source; and
   a second positive feedback element configured to include a second capacitor, a second variable resistance and a second load, and connected between the gate of the second MOS transistor and the drain of the first MOS transistor,
   the second variable resistance being a PMOS transistor, and
   one end of the second load being connected to a connecting point between the PMOS transistor and the second capacitor, and
   the other end of the second load being connected to the second power source.

* * * * *